United States Patent [19]

Simmons et al.

[11] Patent Number: 5,303,405
[45] Date of Patent: Apr. 12, 1994

[54] COMPARATOR SWITCHED SQUELCH RECTIFIER

[75] Inventors: John W. Simmons, Tamarac; Walter H. Kehler, Sunrise, both of Fla.

[73] Assignee: Motorola, Inc., Schaumburg, Ill.

[21] Appl. No.: 753,775

[22] Filed: Sep. 3, 1991

[51] Int. Cl.⁵ .................... H04B 1/16; H04B 1/10
[52] U.S. Cl. .................... 455/213; 455/222; 375/104
[58] Field of Search .......... 455/212, 213, 221, 218, 455/220, 222, 223, 224, 344, 349, 127; 379/402; 375/104; 363/127, 13, 125; 307/608, 107

[56] References Cited

U.S. PATENT DOCUMENTS

| | | |
|---|---|---|
| 3,004,156 | 10/1961 | Coleman et al. .................... 455/213 |
| 4,087,756 | 5/1978 | Rogers, Jr. ......................... 455/213 |
| 4,103,118 | 7/1978 | Bergman ............................ 379/402 |
| 4,132,953 | 1/1979 | Martin, III . |
| 4,388,731 | 6/1983 | King . |
| 4,479,250 | 10/1984 | Flood ................................. 455/213 |
| 4,480,335 | 10/1984 | Kishi ................................. 455/212 |
| 4,533,988 | 8/1985 | Daly et al. .......................... 455/127 |
| 4,637,066 | 1/1987 | Kennedy . |
| 4,680,553 | 7/1987 | Kimura et al. ................... 455/155.1 |
| 4,761,829 | 8/1988 | Lynk, Jr. et al. .................. 455/213 |
| 4,914,715 | 4/1990 | Miyata ............................... 455/213 |
| 4,991,227 | 2/1991 | Kehler et al. . |

Primary Examiner—Reinhard J. Eisenzopf
Assistant Examiner—Lisa Charouel
Attorney, Agent, or Firm—M. Mansour Ghomeshi

[57] ABSTRACT

A squelch circuit (200) having an input is provided including a programmable high pass filter (206) for filtering the input signal to produce a filtered signal. The filtered signal is rectified via a differential rectifier (201) to produce a rectified signal. The squelch circuit (200) also includes a threshold comparator (323) coupled to the differential rectifier (201) for sensing when the rectified signal exceeds a squelch threshold.

11 Claims, 4 Drawing Sheets

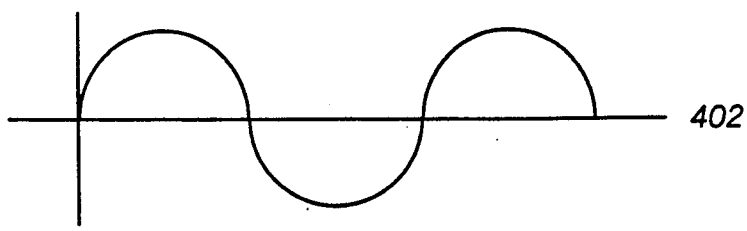
FIG.4a — 402
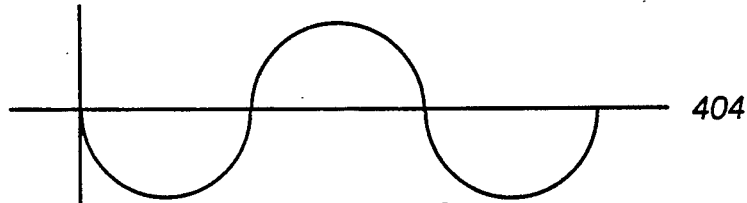
FIG.4b — 404
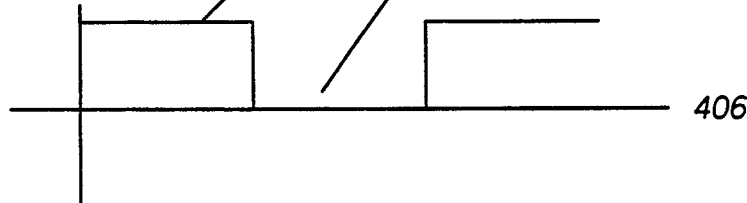
FIG.4c — 406
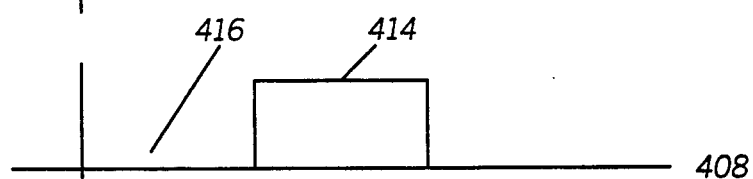
FIG.4d — 408
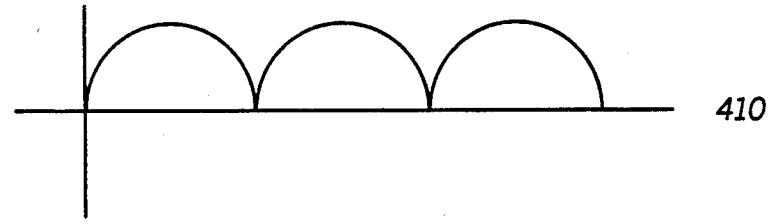
FIG.4e — 410
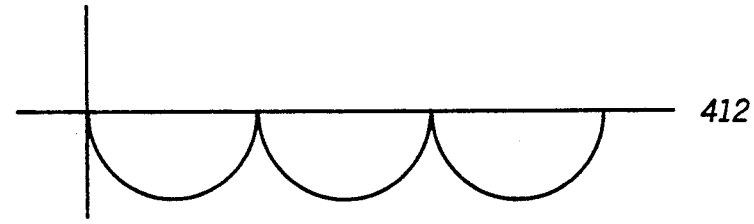
FIG.4f — 412

COMPARATOR SWITCHED SQUELCH RECTIFIER

TECHNICAL FIELD

This invention relates generally to electronic circuits and in particular to a squelch circuit used in communication devices.

BACKGROUND

Modern radio receivers are typically equipped with a squelch circuit to disable the receiver's audio amplifier after the radio frequency carrier is no longer being received by the radio. The squelch circuit prevents noise from being heard at the receiver's speaker during normal radio operation. The basic purpose of a noise squelch circuit is to detect the change in the discriminator output noise as the received carrier strength changes. As the RF carrier strength increases, the discriminator noise decreases. Because the higher frequency noise falls or "quiets" more rapidly than low or mid-range noise and provides faster response time, it is used in most noise squelch circuits to determine the squelch decision (whether to squelch or unsquelch the receiver).

Typically, part of a radio's squelch circuit includes a: noise amplifier stage; pre-emphasis filter stage; limiter stage; a high pass filter stage; noise squelch rectifier stage; DC amplifier stage; and finally a comparator stage for comparing the received signal with the preset squelch level in the radio which is normally set by the radio user.

In FIG. 1 a prior art high pass filter 102 and squelch rectifier circuit 104 such as those used in prior art squelch circuits is shown. In it's typical mode of operation an output signal will reach the output terminal (OUT) of circuit 100 only when the input signal at the input terminal (IN) reaches a level where it can activate the normally "off biased" transistor. Several problems associated with a rectifier and high pass filter combination as shown in circuit 100 include: the compensation for temperature variations; compensation for component variation due to process variation; and the problem of having to vary the components depending on the bandwidth of operation of the radio utilizing circuit 100. Full wave rectifiers using the same bias off scheme are also available, but they share the same problems. However, two of the advantages of such rectifiers are excellent threshold squelch sensitivity and fast transient response for good channel scan performance. Various other half and full-wave rectifier designs exist employing feedback principles which eliminate some of the problems of off-biased rectifiers but which invariably suffer poorer threshold or transient performance or create new problems of their own. A need therefore exists for a squelch rectifier circuit which can overcome the problems associated with the prior art circuits.

SUMMARY OF THE INVENTION

A squelch circuit having an input is provided comprising a programmable high pass filter for filtering the input signal to produce a filtered signal. The filtered signal is rectified via a differential rectifier to produce a rectified signal. The squelch circuit also includes means coupled to the differential rectifier for sensing when the rectified signal exceeds a squelch threshold.

BRIEF DESCRIPTION OF THE DRAWINGS

FIGS. 4a thru 4f are waveforms at different points of the circuit of FIG. 2.

DETAILED DESCRIPTION OF THE PREFERRED EMBODIMENT

Figure 1:
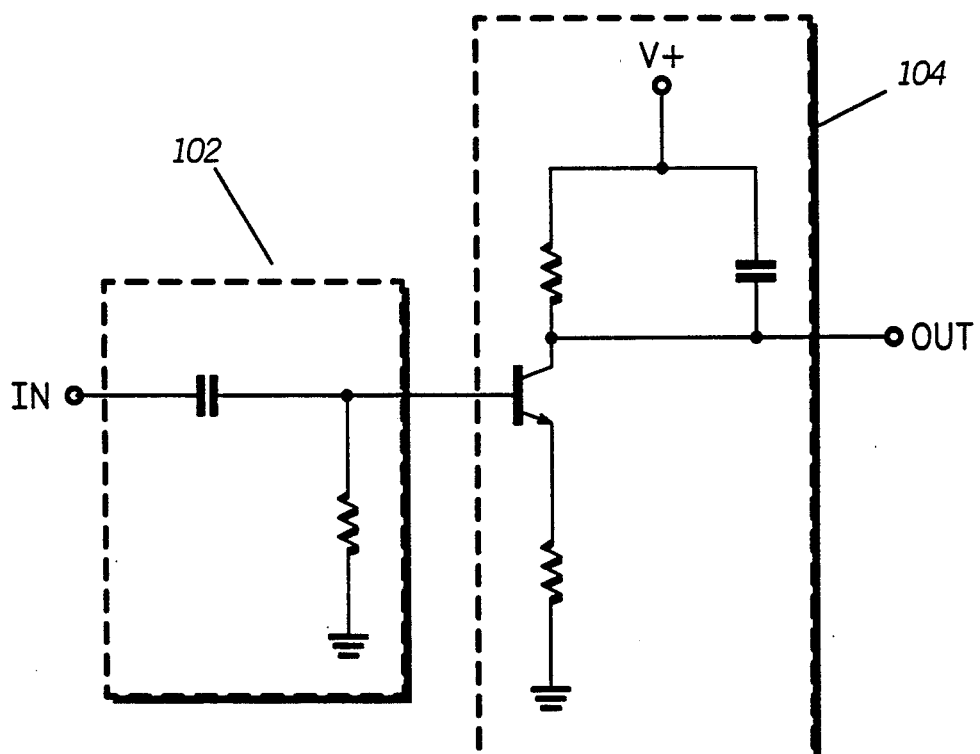
FIG. 1 is a schematic of a prior art high pass filter and squelch rectifier circuit.
Figure 2:
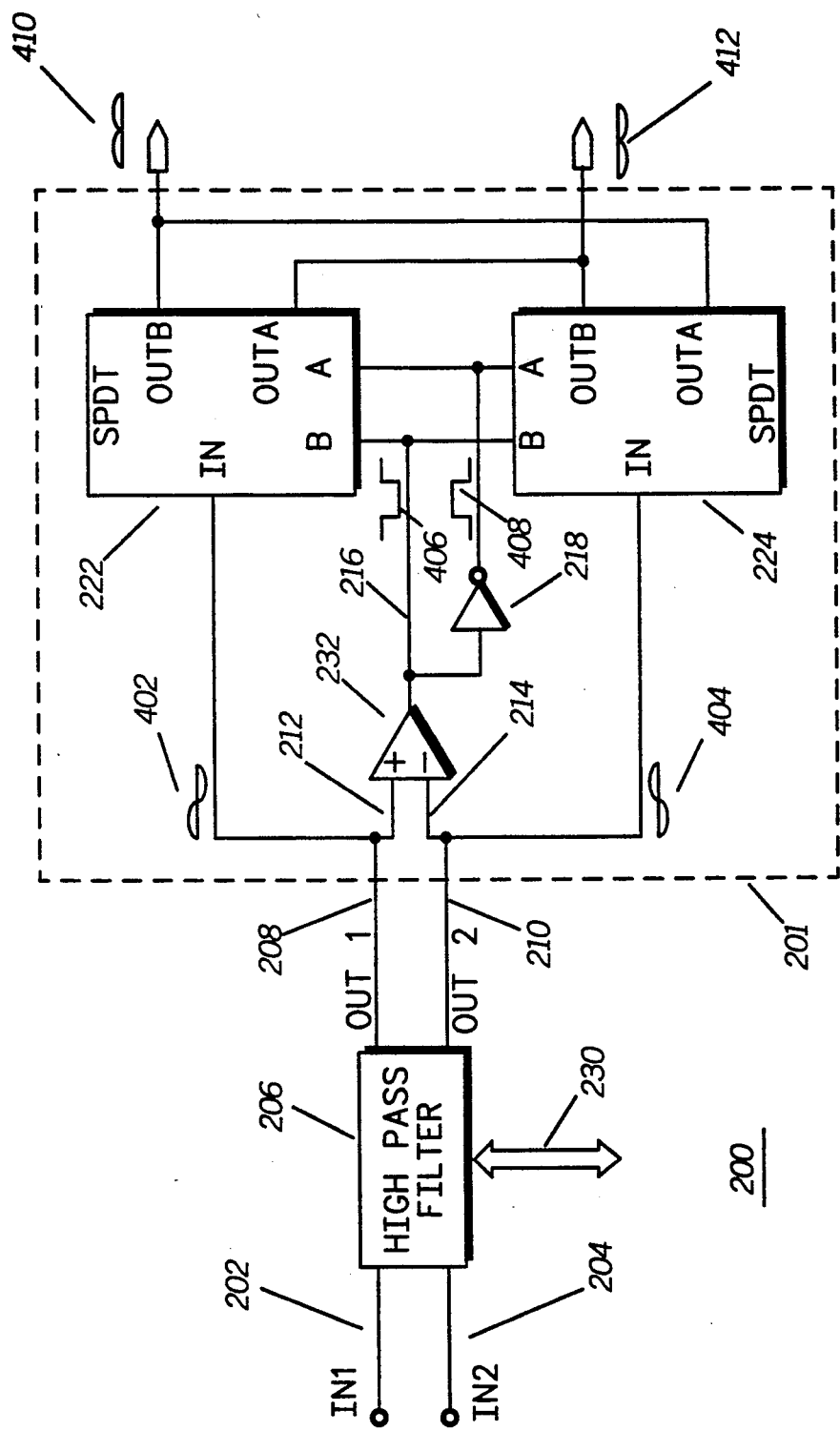
FIG. 2 is a schematic of a high pass filter and squelch rectifier in accordance with the present invention.

Referring now to the drawings and in particular to FIG. 2, a schematic of a high pass filter and squelch rectifier circuit 200 is shown in accordance with the present invention. Two input terminals (IN1 and IN2) 202 and 204 are coupled to the high pass filter circuit 206, providing a differential signal input. Normally the two input terminals are coupled to a squelch limiter 320 preceded by a pre-emphasis filter circuit 318 (shown in FIG. 3). The filter and the limiter pass and limit higher frequency noise but attenuate and limit the audio band (approximately 300 Hz–3000 Hz). In this way, the audio signals are not subject to limiting severe enough to cause large distortion products to enter the squelch rectifier circuit thereby causing a false squelch decision or squelch lock-up.

Figure 3:
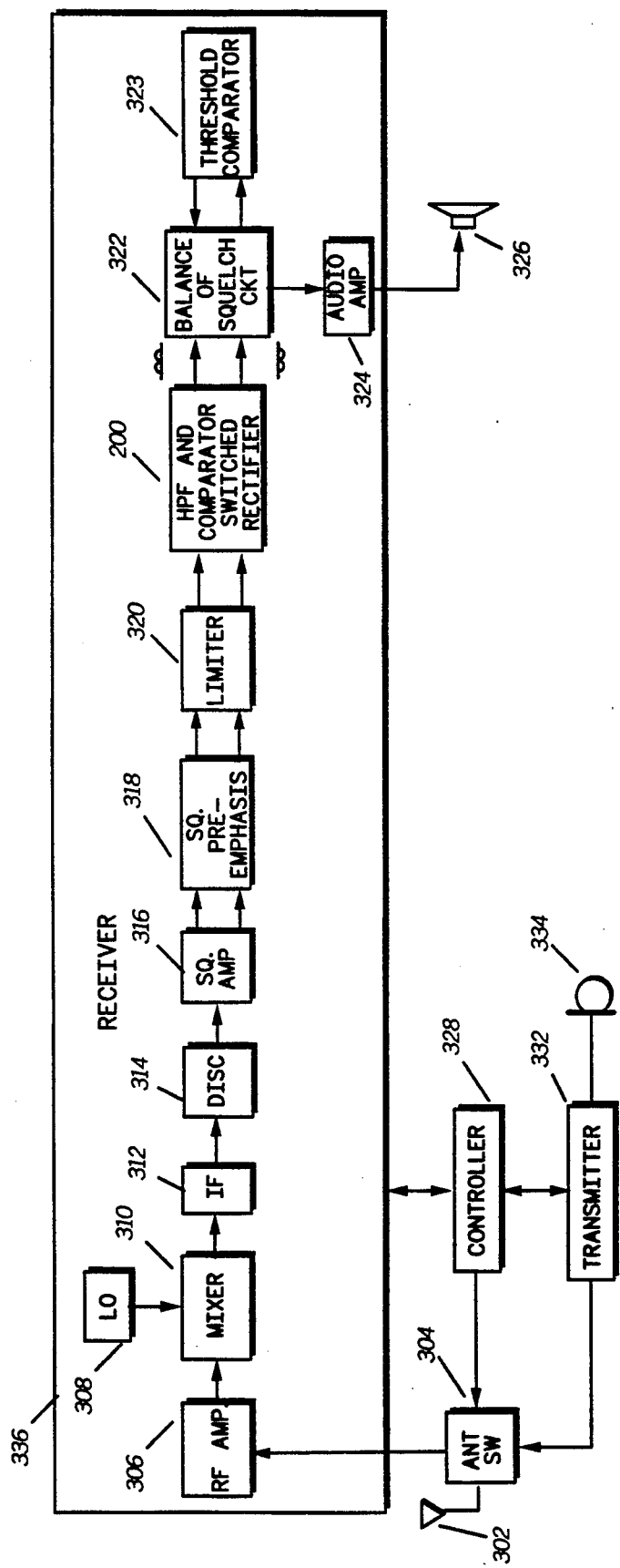
FIG. 3 is a block diagram of a radio in accordance with the present invention.

The high pass filter 206 is preferably a programmable switched capacitor filter having at least two poles as known in the art, having a control bus 230 which is coupled to a controller 328 such as a microprocessor (as shown in FIG. 3). The high pass filter 206 includes a differential operational amplifier to produce differential outputs. The controller 328 can adjust the frequency response of high pass filter 206 by sending control signals via bus 230 which in turn adjusts the operation of filter 206. Once the signal is filtered by the high pass filter 206, corresponding output signals are presented at output terminals 208 and 210 (OUT 1 and OUT 2). Each of the output signals are out of phase with each other by approximately 180 degrees. Output terminals 208 and 210 are in turn coupled to a rectifier 201 which is a fully differential pass thru design and is preferably fabricated using CMOS (Complementary Metal Oxide Semiconductor) or BIMOS (Bipolar Metal Oxide Semiconductor) technologies. The rectifier 201 includes a comparator 232, an inverter 218, and a couple of switches 222 and 224. Each of the switches 222 and 224 include an input; IN, two outputs; OUTA and OUTB, and two triggers; A and B. The switches 222 and 224 are of the Single Pole Double Throw (SPDT) type controlled by their trigger lines. A high voltage or a "one" on any of the two triggers results in a connection between the input to the corresponding output.

The comparator 232 includes two inputs 212 and 214 and an output 216. The two inputs 212 and 214 are coupled to the two output 208 and 210 of the filter 206. The output 216 is coupled to the B trigger inputs of the switches 222 and 224. The output 216 is also coupled to the input of the inverter 218 whose output is coupled to the trigger inputs A of the switches 222 and 224. The outputs 208 and 210 of the filter 206 are coupled to the inputs of the switched 222 and 224, respectively.

Referring to FIGS. 4a through 4f signals flowing through the rectifier 201 are shown in accordance with the present invention. FIGS. 4a and 4b show waveforms 402 and 404 as applied to the inputs 212 and 214, respectively. The waveforms 402 and 404 are shown to be 180° apart in phase. These two out of phase signals 402 and 404 are compared by the comparator 232 to produce the digital signal 406 of FIG. 4c. This signal 406 is inverted by the inverter 218 to produce the digital signal 408 of FIG. 4d. The signals 406 and 408 consist of highs or "ones" 414 and lows or "zeros" 416. These signals 406 and 408 are applied to the B inputs and A inputs of the switches 222 and 224, respectively. During the portion of time that the B trigger input of the switches 222 is high, the input signal 402 is coupled to the OUTB. Conversely, during the period that the A trigger input is high, the input signal 402 is coupled to the OUTA. From this analysis, it is obvious that the positive transition of the signal 402 will be coupled to the OUTB while the negative transition will be coupled to the OUTA of switch 222. Similarly the OUTA and OUTB of the switch 224 will have the positive and negative transitions of the input signals, respectively. As it is shown, the outputs of the two switches 222 and 224 are connected to each other to produce the two desired full wave rectified signals 410 and 412.

To summarize, the circuit 200 is shown to include the high pass filter 206 and the differential input full wave rectifier 201 that achieves rectification without noise bias. The two switches 222 and 224 are used to switch input signals on and off resulting in rectification. Two trigger inputs control the operation of the switches 222 and 224. The trigger inputs are driven by a comparator that is fed by the input differential signals. At the input of the rectifier 201, there are two differential signals 402 and 404, being 180° apart in phase. At the output of the circuit 201 two rectified signals 410 and 412 are produced.

Using a filter not having sufficient attenuation can lead to problems during threshold squelch setting since too much of the low and midband noise is passed from the high pass filter to the rectifier 201 resulting in poor threshold squelch response i.e. 8 dbQ instead of the desired 2 dbQ. A significant advantage of the filter 206 having at least two poles in front of the rectifier 201 is that it provides a sufficient attenuation to the low and mid band noise thereby allowing excellent threshold squelch sensitivities while still preserving high tight squelch settings.

In FIG. 3 a block diagram of a communication device such as a radio 300 in accordance with the present invention is shown. Radio 300 includes a transmitter 332 having a microphone 334 input for providing voice inputs to the transmitter 332. Coupled to the transmitter 332 is the controller 328 which controls the overall operation of transmitter 332 and of receiver 336. Both the receiver 336 and the transmitter 332 are selectively coupled to antenna 302 via an antenna switch 304.

Receiver 336 comprises a radio frequency amplifier stage 306 for amplifying the received signal which is in turn coupled to a conventional mixer stage 310. Mixer stage 310 mixes the amplified input signal coming from RF amplifier 306 with a local oscillator (LO) 308. The mixed signal is then applied to a conventional IF section 312. The IF signal is coupled to a conventional FM discriminator circuit. The output of the discriminator is coupled to a squelch noise amplifier 316, squelch pre-emphasis 318 and limiter 320 stages.

The squelch noise amplifier 316, pre-emphasis circuit 318 and limiter 320 stages are differential and their function is to amplify and shape the noise spectrum.

The differential outputs of the limiter 320 are coupled to the circuit 200. The rectified signals at the output of the circuit 200 are coupled to an attenuator by means of which the user sets the squelch. Following the attenuator is a low pass filter and a squelch tail circuit as is known in the art. The combination of these three elements is shown by a block 322 identified as the balance of the squelch circuit. Coupled to the circuit 322 is a threshold detector 323 which senses when the rectified signal exceeds a squelch threshold. The threshold detector 323 is preferably a threshold comparator which provides a control signal to the controller 328 when the receiver 336 should be squelched. The demodulated audio from the circuit 322 is coupled to an audio amplifier 324. The amplified audio is then applied to a speaker 326 for presentation to a user.

A significant advantage offered by this combination is the ability to easily handle all types of noise spectra out of the discriminator through the use of programmable poles on the high pass filter. This feature enables the receiver 300 to move poles of the filter via the controller 328. In the prior art, the different noise spectra were handled through the use of various external capacitors and resistors.

Yet another significant advantage offered by this invention is the independence of the rectifier 201 from temperature or process variations. With no off bias circuitry, the need for compensatory circuits to offset temperature and/or process variations which are inherent in off bias rectifiers is eliminated. Additionally, because rectifier 201 uses no feedback, transient response is stable and fast for excellent channel scan performance. As a result, the circuit 200 provides a superior temperature response and process immunity while maintaining fast transient response and good threshold squelch. Furthermore, the movable switch capacitor filter poles ensure compatibility with different radio bands with no external parts.

What is claimed is:

1. A receiver for receiving radio frequency signals, comprising:
    a squelch circuit for squelching the receiver, including;
    a programmable high pass filter having at least two poles for filtering the received signal to produce a filtered signal;
    an integrated differential rectifier coupled to the filter for rectifying the filtered signal to produce a rectified signal, the differential rectifier comprises:
    an amplifier having an output;
    an inverter coupled to the output of the amplifier;
    a first switch coupled to the output of the amplifier;
    a second switch coupled to the inverter;
    means for sensing when the rectified signal is above a threshold; and
    squelch means responsive to the means for sensing to squelch the receiver.

2. The squelch circuit of claim 1, wherein the filter comprises a switch capacitor filter.

3. The squelch circuit of claim 1, wherein the filter has at least two poles.

4. The squelch circuit of claim 1, wherein the differential rectifier comprises a Complementary Metal Oxide Semiconductor (CMOS) rectifier.

5. The squelch circuit of claim 1, wherein the differential rectifier comprises a Bipolar Metal Oxide Semiconductor (BIMOS) rectifier.

6. The receiver of claim 1, wherein the means for sensing comprises a comparator.

7. The receiver of claim 6, wherein the comparator is a threshold comparator.

8. A squelch circuit having an input for use in a receiver, the circuit comprising:
   a switched capacitor high pass filter having at least two poles for filtering a signal at the input of the circuit to produce a filtered signal; and
   a temperature-stable integrated differential rectifier coupled to the filter for differentially rectifying the filtered signal to produce a rectified signal;
   the differential rectifier comprising:
      an amplifier having an output;
      an inverter coupled to the output of the amplifier;
      a first switch coupled to the output of the amplifier; and
      a second switch coupled to the inverter;
   comparator means for comparing the rectified signal with a threshold to determine when to squelch the receiver.

9. The squelch circuit of claim 8, wherein the filter is a differential filter.

10. The receiver of claim 8, wherein the differential rectifier comprises a Complementary Metal Oxide Semiconductor (CMOS) rectifier.

11. The receiver of claim 8, wherein the differential rectifier comprises a Bipolar Metal Oxide Semiconductor (BIMOS) rectifier.

* * * * *